Aug. 5, 1958 R. N. HURST 2,846,584

SYNCHRONIZED OSCILLATOR

Filed Jan. 2, 1957 2 Sheets-Sheet 1

INVENTOR.
Robert N. Hurst
BY F. A. Rechif
ATTORNEY

INVENTOR.
Robert N. Hurst
BY
ATTORNEY 2,846,584
Patented Aug. 5, 1958

2,846,584

SYNCHRONIZED OSCILLATOR

Robert N. Hurst, Haddonfield, N. J., assignor to Radio Corporation of America, a corporation of Delaware Application January 2, 1957, Serial No. 632,233

12 Claims. (Cl. 250—36)

This invention relates to a synchronized oscillator, and more particularly to a locked oscillator useful as a frequency divider.

The locking of sine-wave oscillators serving as frequency dividers, to give either unity or larger division ratios, can be best explained on an energy basis. An oscillator tends to oscillate in such a way that the least possible amount of energy is required for a given set of conditions. If an alternating voltage having a frequency approximately equal to the oscillator frequency is injected into the oscillator circuit from an external source, the oscillator will tend to shift its frequency to agree with the injected frequency, because the oscillator can then oscillate so as to require less energy from the source by utilizing the energy contained in this injected voltage. It cannot utilize this energy unless its oscillations and the external source output match exactly in frequency. Therefore, a shift in oscillator frequency toward the frequency of the injected voltage fulfills the natural tendency of the oscillator to operate at the lowest possible energy state. Similarly, if a harmonic of the frequency of the oscillator be injected into the oscillator, the oscillator will shift its frequency so that one of its own harmonics agrees in frequency with the injected voltage, thus utilizing the injected energy in sustaining its own oscillations. For example, if a frequency nearly equal to the fifth harmonic of an oscillator be injected into the oscillator, the oscillator will change its fundamental to a frequency one-fifth of the injected frequency, thus becoming a 5:1 counter or frequency divider. Under these conditions (wherein the only frequency the oscillator can assume is some frequency equal to, or a submultiple of, the injected frequency), the oscillator will "lock" in frequency with, and bear some fixed phase relationship to, the injected energy.

The conventional locked oscillator frequency divider operates with the controlling energy injected into its circuit by a minimum-value capacitor connecting high-impedance points in the controlling and controlled (locked oscillator) circuits, respectively. This method of injection, however, sharply limits the amount of energy that can be injected without blocking the grid of the controlled oscillator tube, or causing intolerable interaction between the two tuned circuits. Hence, the lock-in range of the usual circuit is limited.

An object of this invention is to provide a novel synchronized oscillator circuit, in which the lock-in range is greatly augmented as compared with prior circuits.

Another object is to provide a synchronized oscillator circuit by means of which the energy transferred from the controlling circuit to the controlled circuit is greatly increased, as compared with prior circuits.

The objects of this invention are accomplished, briefly, in the following manner: The locked oscillator is so connected to the circuit of the locking source that it forms an important part of the latter, that is, an "integral" part thereof. This means that the resonant frequency of the tank circuit of the driving, controlling, or locking source depends not only on the impedances of lumped circuit elements, but also on the cathode input impedance of the driven, controlled, or locked oscillator. Specifically, this "integral" connection is effected by connecting the series combination of a resistor and a capacitor across the inductance-capacitance (LC) tank circuit of the controlling source, and by connecting the cathode of the driven or locked oscillator tube through a galvanic (direct current) connection to the junction of this last-mentioned resistor and capacitor, in such a way that the anode or plate current of the oscillator tube flows through this resistor.

A detailed description of the invention follows, taken in conjunction with the accompanying drawings, wherein.

Figures 2, 3:
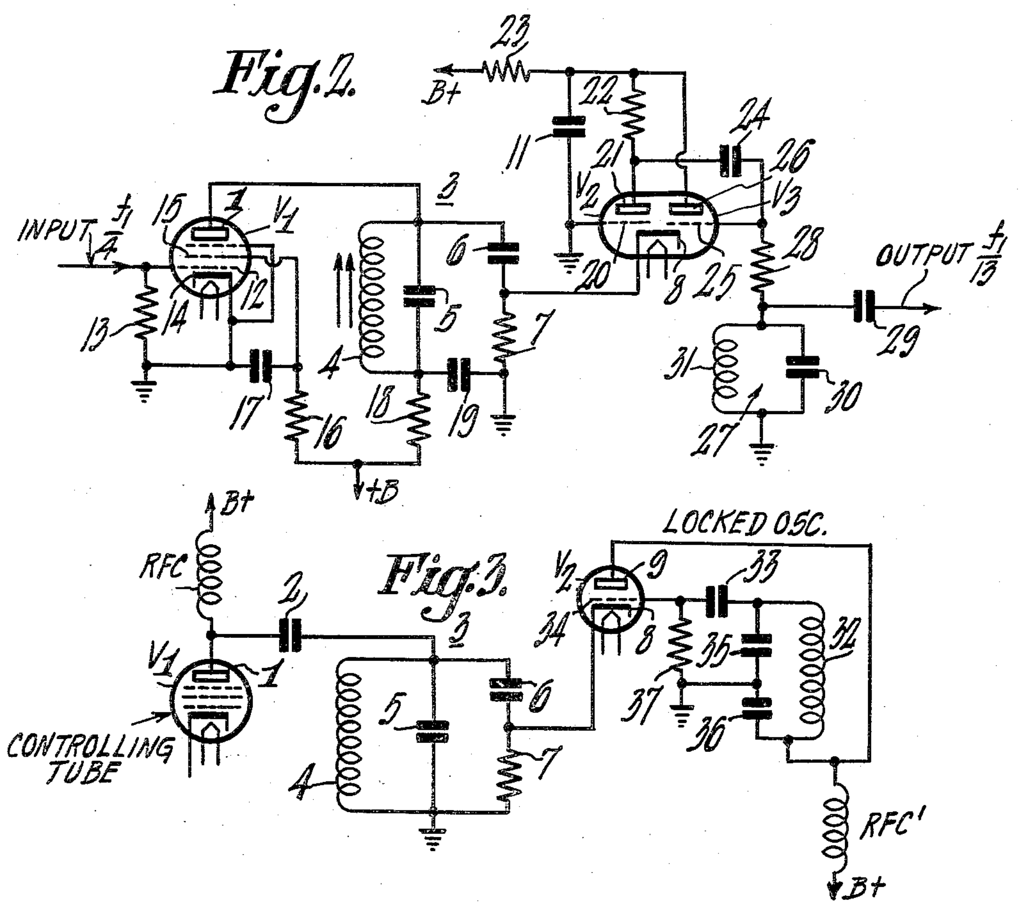
Fig. 2 is a schematic diagram of a circuit according to this invention, as it might be used in practice for frequency division.
Fig. 3 is a schematic diagram of a different type of oscillator, locked in by a circuit arrangement according to this invention.
Figures 5, 6:
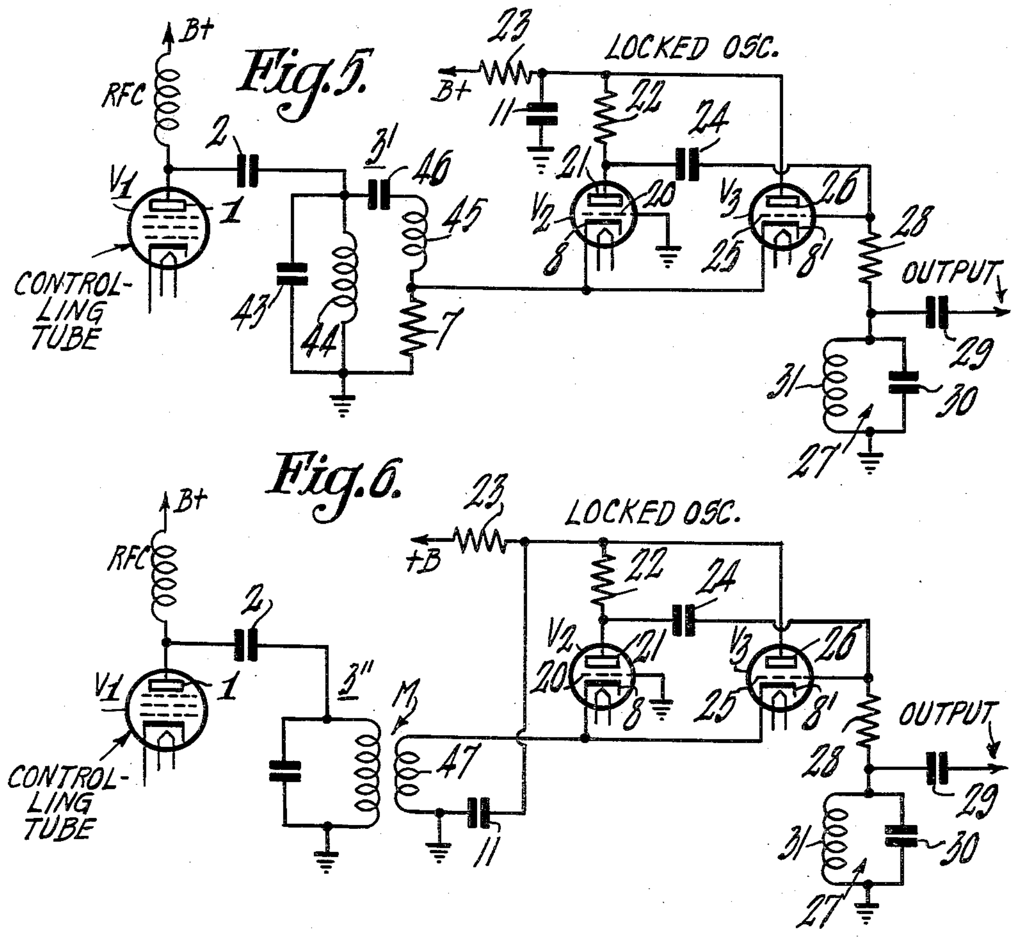

Fig. 5 is a schematic diagram of a modified arrangement according to this invention, utilizing the same type of oscillator as illustrated in Fig. 2 but utilizing a modified form of driving tank circuit; and Fig. 6 is a schematic diagram of another arrangement according to this invention, utilizing the same type of oscillator as illustrated in Fig. 2 but utilizing another form of driving tank circuit.

Figure 1:
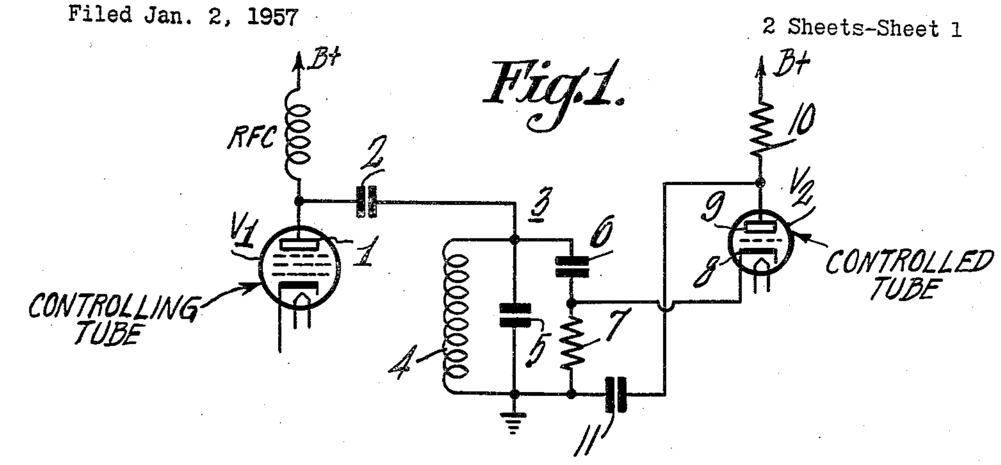
Fig. 1 is a schematic diagram of a basic circuit according to this invention, illustrating the connections between the controlling source and the controlled oscillator.

Fig. 1 illustrates a basic circuit according to this invention, in which the controlled tube is made an "integral" part of the controlling circuit. The controlling tube $V_1$ may be an oscillator, an amplifier, or an amplifier-multiplier, depending upon the particular circumstances. In either of the latter two cases, tube $V_1$ would be fed with oscillatory energy from a suitable source (for example, a source of stable frequency), while in the former case, oscillatory energy is generated in the tube directly. In any case, oscillatory energy appears at the anode 1 of tube $V_1$ (which anode is coupled through a radio frequency choke RFC to the positive terminal B+ of a source of unidirectional polarizing potential), and this oscillatory energy is coupled through a coupling (D. C. blocking) capacitor 2 to the upper (high radio frequency potential) end of a resonant tank circuit designated generally as 3. No matter how tube $V_1$ is connected to operate (that is, in any one of the three ways previously mentioned), oscillatory energy of frequency $f_1$ appears in the tank circuit 3, and this energy is used for synchronizing or locking in a following controlled tube (oscillator) stage $V_2$.

Tank circuit 3 comprises three parallel-connected branches, with at least one impedance in each branch. The first branch is constituted by an inductor 4, the second branch is constituted by a capacitor 5, while the third branch is constituted by a capacitor 6 and a resistor 7 connected in series. The lower end of tank circuit 3 is grounded, so that this end is connected to the negative terminal of the undirectional anode potential source and is also placed at zero radio frequency potential.

The cathode 8 of an electrode structure (electron flow control device) $V_2$ is connected to the junction of resistor 7 and capacitor 6 by a galvanic connection (i. e., one capable of passing direct current), this connection being direct and devoid of any concentrated impedance. The anode 9 of structure $V_2$ is connected through a resistor 10 to the positive terminal B+ of the unidirectional anode potential source, so it may be seen that the anode-cathode direct current of tube $V_2$ flows through resistor 7. Resistor 7 is a cathode impedance for electrode structure $V_2$ and is connected between cathode 8 and ground. A D. C. blocking capacitor 11 is connected from the anode 9 to ground.

The controlled tube $V_2$ is made an "integral" part of the controlling circuit 3 (which is the tank circuit of the controlling tube $V_1$). Stated in another way, the controlled tube $V_2$ forms an important part of the controlling circuit 3, such that the resonant frequency of the driving tank circuit 3 depends not only on the impedance values of inductor 4 and capacitor 5, but also on the impedance of capacitor 6 and the cathode input impedance of the controlled tube $V_2$, since capacitor 6 forms a portion of one of the branches of the tank circuit 3 and since cathode 8 of tube $V_2$ is connected to the tank circuit by a galvanic connection. The system is so designed that the tank circuit 3 will not function properly without the presence of the controlled tube $V_2$.

The total tank capacitance for inductor 4 is very nearly the sum of the capacitances of capacitors 5 and 6, since capacitances connected in parallel add and since the impedance of resistor 7 and tube $V_2$ in parallel is rather small. The circulating tank current divides between capacitors 5 and 6 (which in practice, by way of example, may be nearly equal), and thereby transfers a comparatively large amount of energy to the portion of the circuit constituted by resistor 7 and tube $V_2$. If tube $V_2$ is made the active element in an oscillatory circuit (i. e., if connections are provided such that tube $V_2$ functions as an oscillator tube), that oscillatory circuit exhibits a marked tendency to oscillate at the frequency $f_1$ of the oscillatory energy in tank circuit 3 or at a subharmonic of frequency $f_1$. Such an oscillator would then be a locked oscillator, operating as a frequency divider to divide the frequency $f_1$ by unity or by a division factor greater than unity. Making the controlled tube $V_2$ an "integral" part of the controlling circuit 3 (according to this invention) increases greatly the energy transferred to the circuit of the controlled tube, and hence augments the lock-in or hold-in range of the oscillator provided by tube $V_2$ and its connections.

Fig. 2 is a schematic diagram of a circuit according to this invention, basically the same as that in Fig. 1 but illustrating a practical form of locked-oscillator frequency divider. In Fig. 2, the controlling tube $V_1$ may be a type 6AU6 pentode vacuum tube, for example, connected to operate as a quadrupler. The control grid 12 of electrode structure $V_1$ may be supplied with oscillatory energy having a frequency of $f_1/4$. This energy applied to grid 12 via the lead labelled "Input" may be derived, for example, from a stable crystal-controlled oscillator operating at a frequency of 3.579545 mc. by way of two cascaded frequency dividing stages providing a total division factor of thirty-five, so that the $f_1/4$ frequency supplied to control grid 12 may have a value of 102.273 kc. A resistor 13 is connected from grid 12 to ground. The cathode 14 of structure $V_1$ is grounded, and the suppressor grid of this structure is connected to cathode 14. The screen grid 15 of structure $V_1$ is connected to the positive terminal B+ of the unidirectional potential source through a resistor 16, and is bypassed to ground by way of a capacitor 17. The anode 1 of structure $V_1$ is connected directly, through a connection devoid of concentrated impedance, to the upper (high radio frequency potential) end of the tank circuit 3. Tank circuit 3 has three parallel-connected branches, just as in Fig. 1. In Fig. 2, however, the lower end of inductor 4, instead of being connected to ground, is connected through a resistor 18 to the positive terminal B+ of the unidirectional potential source, in order to provide a direct current (D. C.) path to the anode 1. The lower end of inductor 4 is bypassed to ground for high frequencies by means of a capacitor 19.

The tank circuit 3 is tuned to a frequency of $f_1$, which in our example would be 409.091 kc. Structure $V_1$ is biased and connected to operate as a frequency multiplier, specifically a quadrupler, so that the input frequency $f_1/4$ fed to tube $V_1$ appears as oscillatory energy of a frequency $f_1$ in tank circuit 3, and this latter energy is used to synchronize or lock in the oscillator now to be described, in such a way that such latter oscillator operates as a frequency divider to provide a division factor of thirteen, for example. The frequency of operation of the last-mentioned oscillator is $f_1/13$, which in the example given is 31.46852 kc. Although an integral division factor greater than unity has been mentioned for the oscillator, the arrangement of this invention will operate equally well for locking in an oscillator which provides a division factor of unity. Non-integral division factors may also be used, though it is desired to be pointed out that very high division factors, and also non-integral division factors, always exhibit a smaller lock-in or hold-in range.

In Fig. 2, the oscillator comprises two electrode structures $V_2$ and $V_3$ connected as a cathode-driven oscillator having a two-terminal resonant output circuit. Such an oscillator is sometimes known as a two-terminal oscillator. The oscillator to be described is somewhat similar to those disclosed in Crosby Patent No. 2,269,417 and in Sziklai Patent No. 2,509,280. The electrode structures $V_2$ and $V_3$ may be arranged in a single envelope with a common cathode 8, as shown (a type 6J6 vacuum tube may be used here, for example), or in a single envelope with separate cathodes, or in separate envelopes. The two electrode structures $V_2$ and $V_3$ are preferably of the triode type and each of them has a control electrode and an anode, related to the cathode 8. The grid 20 of the lefthand electrode structure $V_2$ is grounded, and the anode 21 of this structure is connected to the positive terminal B+ of the unidirectional anode potential source through two series-connected resistors 22 and 23. The anode 21 is also connected through a coupling capacitor 24 to the grid 25 of the righthand structure $V_3$, and the anode 26 of electrode structure $V_3$ is connected to the junction of resistors 22 and 23. A bypass capacitor 11 is connected from the junction of resistors 22 and 23 to ground.

The LC resonant output circuit for the locked oscillator including structures $V_2$ and $V_3$ is designated 27, and comprises an inductor 31 and a capacitor 30 connected in parallel. One side of this parallel-connected LC circuit is grounded and the opposite side is connected to grid 25 through a resistor 28. The purpose of resistor 28 is to increase the oscillator loop gain at harmonic frequencies. The output circuit 27 is tuned approximately to a predetermined frequency, which latter frequency is $f_1/13$.

The structures $V_2$ and $V_3$ have a common cathode impedance 7. This cathode coupling, together with the intercoupling through capacitor 24, causes the structures $V_2$ and $V_3$ to function as a cathode-coupled or cathode-driven oscillator, generating oscillatory energy the frequency of which is determined partly by the resonant frequency of the two-terminal resonant output circuit 27. For a more detailed explanation of this type of oscillator, reference may be had to the two patents previously referred to.

The output of the cathode-driven oscillator referred to is taken from the upper or high radio frequency potential end of tuned circuit 27 and is coupled to a suitable utilization circuit (e. g., an amplifier) by means of a coupling capacitor 29.

As in Fig. 1, the resonant tank circuit 3 (driving source's output circuit) has three parallel-connected branches each constituted by at least one impedance, the first being constituted by an inductor 4, the second by a capacitor 5, and the third by a resistor 7 and a capacitor 6 in series. The common cathode 8 (or the two connected cathodes, if the two electrode structures $V_2$ and $V_3$ have separate cathodes) is connected to the junction of resistor 7 and capacitor 6 by a galvanic connection which is direct and devoid of any concentrated impedance. Resistor 7 thus serves as a cathode impedance for the single cathode 8, or as a common cathode impedance, if two cathodes are utilized. In this way, as in Fig. 1, the structures $V_2$ and $V_3$ are made an "integral" part of the controlling circuit 3, such that the latter circuit will not function properly without the presence of the controlled electrode structures $V_2$ and $V_3$. The resonant frequency of the driving tank circuit 3 depends not only on the impedance values of components 4 and 5, but also on the impedance of capacitor 6 and the cathode input impedance of the structures $V_2$ and $V_3$. Again, a comparatively large amount of energy is transferred from tank circuit 3 to the oscillator including structures $V_2$ and $V_3$. The cathode-driven oscillator described thus exhibits a marked tendency to lock-in with the synchronizing frequency $f_1$ appearing in the tank circuit 3, that is, to oscillate at that subharmonic (including unity) of frequency $f_1$ which is closest to the natural resonant frequency of output circuit 27. The oscillator $V_2$, $V_3$ is then a locked oscillator, operating as a frequency divider to divide the synchronizing frequency $f_1$ by unity or by a division factor greater than unity.

It has been pointed out previously that the capacitance values of capacitors 5 and 6, for a typical circuit, may be nearly equal. If the capacitance of capacitor 5 is made very much greater than that of capacitor 6, the circuit degenerates into a simple cathode-injection circuit, and exhibits none of the advantages (e. g., augmented lock-in range) set out above. Moreover, if the capacitance of capacitor 6 is made very much greater than that of capacitor 5, the unilateral conductivity of structures $V_2$, $V_3$ will upset the functioning of the tank circuit 3 to the point where the circulating tank current (limited in the reverse direction by resistor 7) will become too small to control $V_2$, $V_3$ effectively. Between these two extremes, there is an optimum value for the ratio of the capacitance of capacitor 6 to that of capacitor 5 ($C_6/C_5$), which may be determined experimentally in a manner to be described hereinafter. This ratio, which may thus be seen to be somewhat critical, is very nearly equal to unity and gives a lock-in range of more than six times the lock-in range provided by a low capacitance ratio ($C_5$ very much greater than $C_6$) or by a high capacitance ratio ($C_6$ very much greater than $C_5$).

The critical ratio of the capacitance of capacitor 6 to that of capacitor 5 ($C_6/C_5$) may be determined experimentally in the following way. Initially, the capacitor 5 should be made the principal capacitive element tuning inductor 4; that is, $C_6$ should be so small as to be negligible. The capacitor 30 (connected across the inductor 31 to form the resonant output circuit 27), which in a practical embodiment may have a value of 468 mmf., should be replaced by two capacitors in parallel, one of about 368 mmf. capacitance and the other a calibrated variable precision capacitor $C_v$, capable of being varied from about 30 mm. to about 200 mmf. $C_5$ and $C_6$ should both be variable.

With the tank 3 excited by a constant frequency, the variable capacitor $C_v$ is adjusted until the oscillator locks at the desired division ratio, which in the example is thirteen. Then $C_v$ is varied upwards to determine the capacitance $C_{up}$ at which the oscillator falls out or becomes unlocked. Then, $C_v$ is varied downwards to determine the capacitance $C_{dn}$ at which the oscillator again falls out. The difference between these two capacitance values, $C_{up}-C_{dn}$, is an indication of the hold-in range or lock-in range, $\Delta R$, of the oscillator. It is desirable to make this range as large as possible.

Now, $C_6$ is increased slightly, to the point where it noticeably detunes circuit 3. $C_5$ is then readjusted so that the tank 3 (which now includes all of components 4, 5, and 6) again is on frequency. Next, the hold-in range, $\Delta R$, is determined as previously described. It will be found to have increased slightly.

The procedure in the preceding paragraph is repeated, each time increasing $C_6$ slightly, readjusting $C_5$ to retune the tank 3, and measuring $\Delta R$. It will be found that $\Delta R$ will increase each time $C_6$ is increased, up to a certain point. At this point, a further increase in $C_6$ will decrease $\Delta R$. The proper values for $C_6$ and $C_5$ will then be those values which give the largest $\Delta R$, i. e., those values attained as described above, just before $\Delta R$ begins to decrease with increasing $C_6$.

The most important characteristic of this operating point (attained in the manner just described) is the greatly increased hold-in range, $\Delta R$, as compared to prior art circuits. At this critical operating point, $\Delta R$ (the hold-in or lock-in range) is "maximized." At this point, the coupling between the locking source (including tank circuit 3) and the locked oscillator (including structures $V_2$ and $V_3$ and output circuit 27) is "maximized." In the experimental determination of the critical ratio $C_6/C_5$ as above described, the coupling is deliberately increased to the point where: (1) increasing or decreasing the coupling diminishes $\Delta R$; and (2) the locked oscillator forms an important part ("integral" part) of the circuit of the locking source, i. e., the circuit 3 of the locking source will not function properly without the presence of the locked oscillator. In other words, this latter characteristic means that at the critical operating point, the resonant frequency of the driving tank 3 depends not only on the values of inductor 4 and capacitor 5, but also on the values of capacitor 6 and on the cathode input impedance of the oscillator $V_2$, $V_3$.

The following values for certain of the components of Fig. 2 are given by way of example. These values are those used in a circuit arrangement according to this invention which was built and successfully tested.

| | | |
|---|---|---|
| Resistor 7 | ohms | 2200 |
| Resistor 13 | do | 82,000 |
| Resistor 16 | do | 39,000 |
| Resistor 18 | do | 8200 |
| Resistor 22 | do | 22,000 |
| Resistor 23 | do | 1000 |
| Resistor 28 | do | 3900 |
| Capacitor 5 | mmf | 56 |
| Capacitor 6 | mmf | 68 |
| Capacitor 11 | mfd | .01 |
| Capacitor 17 | mfd | .01 |
| Capacitor 19 | mfd | .01 |
| Capacitor 24 | mmf | 270 |
| Capacitor 29 | mmf | 22 |
| Capacitor 30 | mmf | 468 |

Although in Fig. 2 the locking source (tube $V_1$ and tank circuit 3) is disclosed as a frequency multiplier (quadrupler) stage, the circuit will operate equally well between two oscillators, that is, where one oscillator is used to synchronize or lock in another oscillator, the latter operating as a frequency divider.

Fig. 3 is a circuit diagram illustrating an extension of the technique described previously in connection with Figs. 1 and 2. Fig. 3 illustrates a so-called Colpitts oscillator which is synchronized or locked in by a locking source including tank 3. As previously described, the tank circuit 3 has three parallel-connected branches, and the cathode 8 of electrode structure $V_2$ is connected by a galvanic connection to the junction of capacitor 6 and resistor 7, which together constitute one branch of the tank circuit. Due to these connections, the locking source tank circuit 3 requires the presence of the electrode structure $V_2$ in order to function properly, just as in Figs. 1 and 2. In other words, the tube $V_2$ is an "integral" part of the source tank 3, and hence derives a large amount of energy from it. In order to complete the oscillatory connections for tube $V_2$, the anode 9 of this tube is connected to one end of an inductor 32, and the opposite end of this inductor is connected through a capacitor 33 to grid 34 of tube $V_2$. Two capacitors 35 and 36 are connected in series across inductor 32, and the junction point of these capacitors is connected to ground. A resistor 37 is connected from grid 34 to ground, and to complete the connections, a choke RFC′ is connected between the anode end of inductor 32 and the positive terminal B+ of the unidirectional anode potential source. The circuit including structure $V_2$ in Fig. 3 functions as a so-called Colpitts oscillator, generating oscillatory energy whose frequency is locked in by the synchronizing energy appearing in tank circuit 3. The oscillator $V_2$ in Fig. 3 is then a locked oscillator, operating as a frequency divider to divide the synchronizing frequency $f_1$ (appearing in tank circuit 3) by unity or by a division factor greater than unity.

Figure 4:
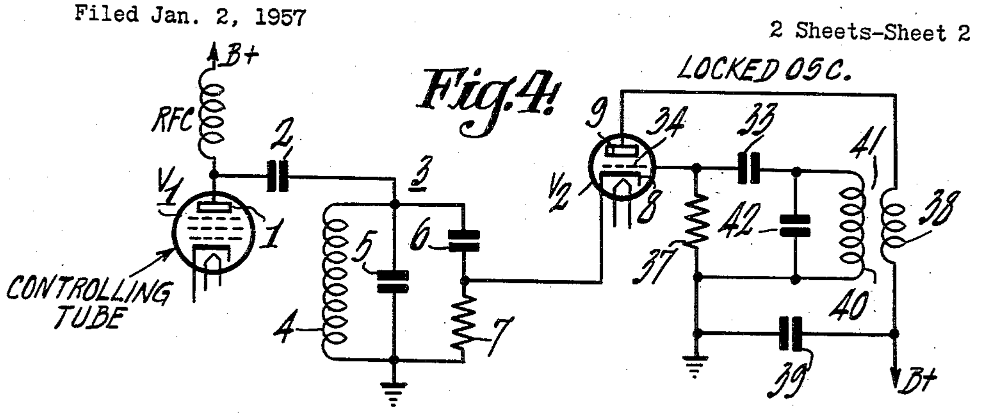
Fig. 4 is a schematic diagram of a still different type of oscillator, locked in by a circuit arrangement according to this invention.

Fig. 4 illustrates a so-called Armstrong oscillator which is synchronized or locked in by a locking source including tank 3. As previously described, the tank circuit 3 has three parallel-connected branches, and the cathode 8 of electrode structure $V_2$ is connected by a galvanic connection to the junction of capacitor 6 and resistor 7, which together constitute one branch of the tank circuit. Due to these connections, the locking source tank circuit 3 requires the presence of the electrode structure $V_2$ in order to function properly, just as in Figs. 1–3. In other words, the tube $V_2$ is an "integral" part of the source tank 3, and hence derives a large amount of energy from it. In order to complete the oscillatory connections for tube $V_2$, the anode 9 of this tube is connected to one end of the primary winding 38 of a transformer 41, and the opposite end of this winding is connected to the positive terminal B+ of the unidirectional anode potential source, which source is bypassed to ground by a capacitor 39. One end of the secondary winding 40 of the transformer 41 is connected through a capacitor 33 to grid 34 of tube $V_2$, while the other end of winding 40 is connected to ground. A capacitor 42 is connected across winding 40, and a resistor 37 is connected from grid 34 to ground. The circuit including structure $V_2$ in Fig. 4 functions as a so-called Armstrong oscillator, generating oscillatory energy whose frequency is locked in by the synchronizing energy appearing in tank circuit 3. The oscillator $V_2$ in Fig. 4 is then a locked oscillator, operating as a frequency divider to divide the synchronizing frequency $f_1$ (appearing in tank circuit 3) by unity or by a division factor greater than unity.

Fig. 5 illustrates a cathode-coupled or cathode-driven oscillator of the type shown in Fig. 2, but driven by a tank circuit 3′ which is the partial conjugate of the tank circuit 3 in Figs. 1–4. In Fig. 5, the tank circuit 3′ has three parallel-connected branches, but in this case the first is constituted by a capacitor 43, the second by an inductor 44, and the third by the series combination of an inductor 45 and a resistor 7. A D. C. blocking capacitor 46 is connected between the upper ends of inductors 44 and 45. The structures $V_2$ and $V_3$ (shown as having two separate cathodes 8 and 8′, although such structures may have a common cathode, as in Fig. 2) have their respective cathodes 8 and 8′ connected together and also connected by a galvanic connection to the junction of inductor 45 and resistor 7. Due to these connections, the locking source tank circuit 3′ requires the presence of the electrode structures $V_2$ and $V_3$ in order to function properly, just as in Figs. 1–4. The tubes $V_2$ and $V_3$ are an "integral" part of the source tank 3′, and hence derive a large amount of energy from it. The tubes $V_2$ and $V_3$ are connected together (by components 11 and 20—31) to form a cathode-coupled or cathode-driven oscillator, just as in Fig. 2, generating oscillatory energy whose frequency is locked in by the synchronizing energy appearing in tank circuit 3′. The oscillator $V_2$, $V_3$ in Fig. 5 is then a locked oscillator, operating as a frequency divider to divide the synchronizing frequency $f_1$ (appearing in tank circuit 3′) by unity or by a division factor greater than unity.

Fig. 6 illustrates a cathode-coupled or cathode-driven oscillator of the type shown in Fig. 2, but coupled by a mutual inductance type of coupling so as to apply the synchronizing energy to the locked oscillator. In Fig. 6, the tank circuit 3″, wherein the oscillatory energy of synchronizing frequency appears, comprises a single parallel-connected LC circuit which is coupled between that side of capacitor 2 remote from anode 1 and ground. The structures $V_2$ and $V_3$ have their respective cathodes 8 and 8′ connected together and also by a galvanic connection to the upper (ungrounded) end of a secondary winding 47 coupled by means of mutual inductance M to the L of circuit 3″. Due to these connections, the locking source tank circuit 3″ requires the presence of the electrode structures $V_2$ and $V_3$ in order to function properly, as in Figs. 1–5. The tubes $V_2$ and $V_3$ are an "integral" part of the source tank 3″ (made so by the mutual inductance M which is analogous to $C_6/C_5$ in the circuit of Figs. 1–4), and hence derives a large amount of energy from it. The determination of the coefficient of coupling, M (see Fig. 6), is analogous to the determination of $C_6/C_5$ in Figs. 1–4. The specific relationship is $$M=-\left(\frac{C_5}{C_6+C_5}\right)L_{47}$$

where $C_5$ is the capacitance of capacitor 5 (see Figs. 1–4), $C_6$ is the capacitance of capacitor 6 (see Figs. 1–4), and $L_{47}$ is the inductance of inductor 47 (see Fig. 6).

In Fig. 6, the tubes $V_2$ and $V_3$ are connected together (by components 11 and 20—31) to form a cathode-coupled or cathode-driven oscillator, just as in Fig. 2, generating oscillatory energy whose frequency is locked in by the synchronizing energy appearing in tank circuit 3″. The oscillator $V_2$, $V_3$ in Fig. 6 is then a locked oscillator, operating as a frequency divider to divide the synchronizing frequency $f_1$ (appearing in tank circuit 3″) by unity or by a division factor greater than unity.

What is claimed is:

1. In a synchronized oscillator system including an electron flow control device oscillator having a resonant output circuit tuned approximately to a predetermined frequency; means for synchronizing said oscillator to operate at said predetermined frequency comprising a resonant tank circuit wherein there appears oscillatory energy of synchronizing frequency, said tank circuit having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; and a galvanic connection between one of the electrodes of said flow control device and one of the branches of said tank circuit, for feeding synchronizing frequency energy to said flow control device to synchronize said oscillator.

2. In a synchronized oscillator system including an electron flow control device oscillator having a resonant output circuit tuned approximately to a predetermined frequency; means for synchronizing said oscillator to operate at said predetermined frequency comprising a resonant tank circuit wherein there appears oscillatory energy of synchronizing frequency, said tank circuit having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; and a galvanic connection between one of the electrodes of said flow control device and the junction of said resistor and capacitor in said third branch, for feeding synchronizing frequency energy to said flow control device to synchronize said oscillator.

3. A synchronized oscillator system comprising at least one electrode structure including an anode electrode, a control electrode, and a cathode electrode; connections intercoupling said electrodes for the generation of oscillations in said structure and connections, thereby to provide an oscillator capable of being synchronized, a resonant tank circuit wherein there appears oscillatory energy of synchronizing frequency, said tank circuit having a plurality of parallel-connected branches in each of which there is at least one impedance; and a galvanic connection between said cathode electrode and one of the branches of said tank circuit, for feeding synchronizing frequency energy to said structure to synchronize said oscillator, said galvanic connection constituting the only coupling for feeding synchronizing frequency energy from said tank circuit to said structure.

4. A synchronized oscillator system comprising at least one electrode structure including an anode electrode, a control electrode, and a cathode electrode; connections intercoupling said electrodes for the generation of oscillations in said structure and connections, thereby to provide an oscillator capable of being synchronized, a resonant tank circuit wherein there appears oscillatory energy of synchronizing frequency, said tank circuit having a plurality of parallel-connected branches in each of which there is at least one impedance and one branch of which is constituted by a resistor and a capacitor in series; and a galvanic connection between said cathode electrode and the junction of said resistor and capacitor, for feeding synchronizing frequency energy to said structure to synchronize said oscillator, said galvanic connection constituting the only coupling for feeding synchronizing frequency energy from said tank circuit to said structure.

5. A synchronized oscillator system comprising at least one electrode structure including an anode electrode, a control electrode, and a cathode electrode; connections intercoupling said electrodes for the generation of oscillations in said structure and connections, thereby to provide an oscillator capable of being synchronized, a resonant tank circuit wherein there appears oscillatory energy of synchronizing frequency, said tank circuit having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; and a galvanic connection between said cathode electrode and one of the branches of said tank circuit, for feeding synchronizing frequency energy to said structure to synchronize said oscillator.

6. A synchronized oscillator system comprising at least one electrode structure including an anode electrode, a control electrode, and a cathode electrode; connections intercoupling said electrodes for the generation of oscillations in said structure and connections, thereby to provide an oscillator capable of being synchronized, a resonant tank circuit wherein there appears oscillatory energy of synchronizing frequency, said tank circuit having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; and a galvanic connection between said cathode electrode and the junction of said resistor and capacitor in said third branch, for feeding synchronizing frequency energy to said structure to synchronize said oscillator.

7. In a frequency generating system: a frequency multiplier electron discharge device stage having an input circuit and an output circuit, said output circuit comprising a resonant tank circuit tuned to a predetermined frequency and having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; means for supplying waves of a stable frequency, which is a submultiple of said predetermined frequency, to said input circuit, a frequency divider stage comprising an electron flow control device oscillator having a resonant output circuit tuned approximately to a frequency equal to or less than said predetermined frequency; and a galvanic connection between one of the electrodes of said flow control device and one of the branches of said tank circuit, for feeding energy of said predetermined frequency to said flow control device.

8. In a frequency generating system: a frequency multiplier electron discharge device stage having an input circuit and an output circuit, said output circuit comprising a resonant tank circuit tuned to a predetermined frequency and having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; means for supplying waves of a stable frequency, which is a submultiple of said predetermined frequency, to said input circuit, a frequency divider stage comprising an electron flow control device oscillator having a resonant output circuit tuned approximately to a frequency equal to or less than said predetermined frequency; and a galvanic connection between one of the electrodes of said flow control device and the junction of said resistor and capacitor in said third branch, for feeding energy of said predetermined frequency to said flow control device.

9. A synchronized oscillator system comprising two electrode structures connected as a cathode-driven oscillator having a two-terminal resonant output circuit; a resonant tank circuit wherein there appears oscillatory energy of synchronizing frequency, said tank circuit having a plurality of parallel-connected branches in each of which there is at least one impedance; and a galvanic connection between the cathode connection of said oscillator and one of the branches of said tank circuit, said galvanic connection constituting the only coupling for feeding synchronizing frequency energy from said tank circuit to said structures.

10. A synchronized oscillator system comprising two electrode structures connected as a cathode-driven oscillator having a two-terminal resonant output circuit; a resonant tank circuit wherein there appears oscillatory energy of synchronizing frequency, said tank circuit having a plurality of parallel-connected branches in each of which there is at least one impedance and one branch of which is constituted by a resistor and a capacitor in series; and a galvanic connection between the cathode connection of said oscillator and the junction of said resistor and capacitor, said galvanic connection constituting the only coupling for feeding synchronizing frequency energy from said tank circuit to said structures.

11. A synchronized oscillator system comprising two electrode structures connected as a cathode-driven oscillator having a two-terminal resonant output circuit; a resonant tank circuit wherein there appears oscillatory energy of synchronizing frequency, said tank circuit having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; and a galvanic connection between the cathode connection of said oscillator and one of the branches of said tank circuit.

12. A synchronized oscillator system comprising two electrode structures connected as a cathode-driven oscillator having a two-terminal resonant output circuit; a resonant tank circuit wherein there appears oscillatory energy of synchronizing frequency, said tank circuit having three parallel-connected branches the first of which is constituted by an inductor, the second of which is constituted by a capacitor, and the third of which is constituted by a resistor and a capacitor in series, the capacitor of said second branch being approximately equal in capacitance to the capacitor of said third branch; and a galvanic connection between the cathode connection of said oscillator and the junction of said resistor and capacitor in said third branch.

References Cited in the file of this patent

UNITED STATES PATENTS

| | | |
|---|---|---|
| 2,248,481 | Schuttig | July 8, 1941 |
| 2,485,919 | Rambo | Oct. 25, 1949 |
| 2,494,795 | Bradley | Jan. 17, 1950 |
| 2,656,465 | Reeves | Oct. 20, 1953 |